United States Patent
Gao

(10) Patent No.: US 11,503,743 B2
(45) Date of Patent: Nov. 15, 2022

(54) HIGH AVAILABILITY FLUID CONNECTOR FOR LIQUID COOLING

(71) Applicant: BAIDU USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 32 days.

(21) Appl. No.: 17/200,145

(22) Filed: Mar. 12, 2021

(65) Prior Publication Data
US 2022/0295671 A1  Sep. 15, 2022

(51) Int. Cl.
  *H05K 7/20* (2006.01)
(52) U.S. Cl.
  CPC .............. *H05K 7/20781* (2013.01)
(58) Field of Classification Search
  None
  See application file for complete search history.

(56) References Cited

U.S. PATENT DOCUMENTS

| | | | |
|---|---|---|---|
| 2016/0010772 A1* | 1/2016 | Tiberghien | F28F 3/12 285/24 |
| 2016/0270260 A1* | 9/2016 | Franz | H05K 7/20781 |
| 2018/0242478 A1* | 8/2018 | Cui | H01R 3/08 |

* cited by examiner

*Primary Examiner* — Mukundbhai G Patel
(74) *Attorney, Agent, or Firm* — Womble Bond Dickinson (US) LLP

(57) ABSTRACT

A blind mating adapter unit is disclosed that is adjustably locatable on a server chassis. The blind mating adapter unit is rotatably adjustable to align the orientation of one or more fluid connectors on the blind mating adapter unit to a corresponding one or more mating fluid connectors on a coolant distribution manifold installed in a server rack. An elliptical frame having an elliptical orbit, coupled to an elliptical plate having a connector channel, can be rotated about a rotation axis continuously or in fixed increments. The connector channel and elliptical orbit define a rotation path for the aligning the fluid connectors and the rotation axis defines the position of the fluid connectors on the rotation path. When the server is slid into place in the server rack, the fluid connectors on the blind mating adapter fluidly couple to the corresponding mating fluid connectors on the coolant distribution manifold. The blind mating adapter unit functions as an intermediate layer for server and rack fluid mating.

20 Claims, 9 Drawing Sheets

HIGH AVAILABILITY FLUID CONNECTOR FOR LIQUID COOLING

FIELD OF THE INVENTION

Embodiments of the present invention relate generally to data center cooling. More particularly, embodiments of the invention relate to server racks, including installation and removal of server equipment that connects to a liquid cooling module.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

A server rack in a data center may contain servers and/or cooling distribution units having different types, sizes, gender, and location of liquid coolant connections. Typically, in a server rack, a coolant distribution unit couples to a coolant distribution manifold at the back of the server rack. Each server that requires liquid cooling will be connected to the coolant distribution manifold. The coolant distribution manifold often comprises a variety of interconnection hoses or a pair of distribution manifolds in the form of sealed square tubing with fluid connectors placed at fixed intervals along the tubing of the manifold. There are different types of rack manifold designs for server rack equipment connection sizes, locations, connector types, or genders. Servers and cooling distribution units in server racks require periodic service such that it is necessary to disconnect the liquid coolant connections at the back of the server rack to remove and service the server. Those connections are often deep in the back of the server rack and are not easily accessible.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
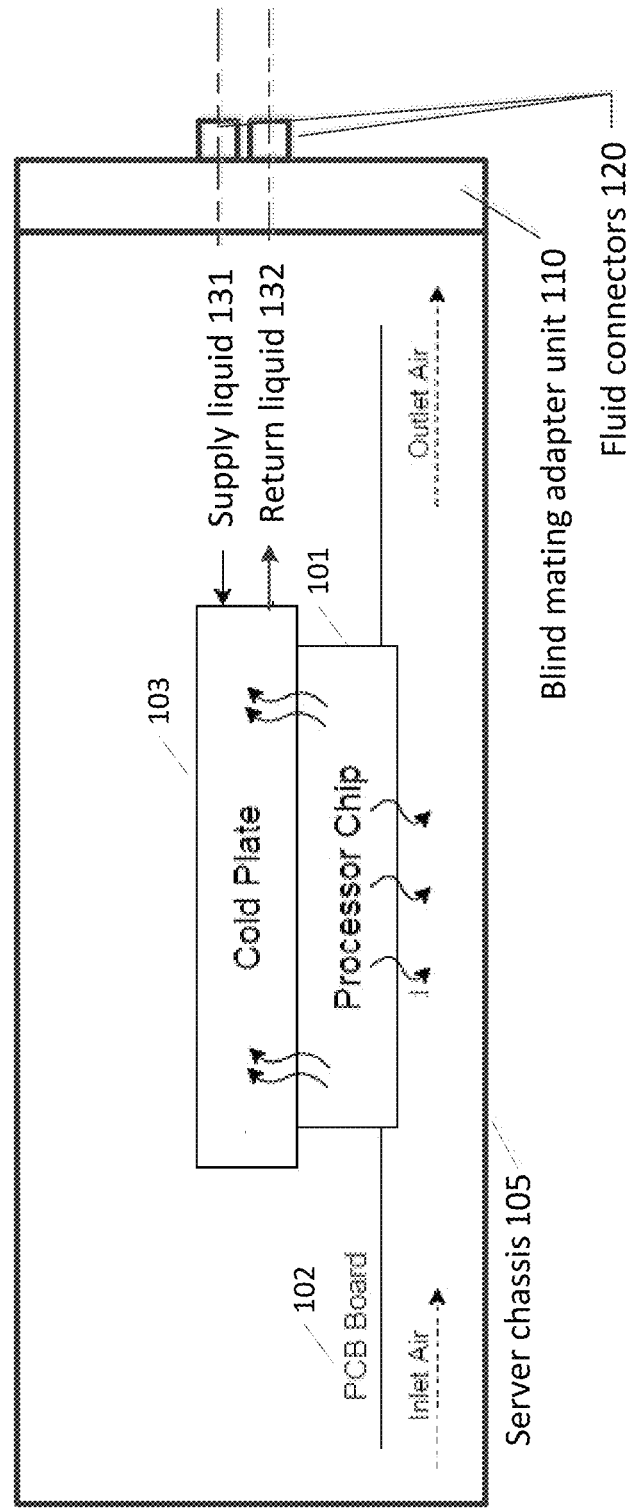
FIG. 1 is a block diagram illustrating an example of a cooling module in a server chassis having a blind mating adapting unit, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In a first aspect, a blind mating adapter unit is configured to fluidly couple a server in an electronic rack (also termed "server rack") to a coolant distribution manifold via blind mating. Blind mating happens via a sliding or snapping action which can be accomplished without wrenches or other tools. Blind mating can include self-aligning features which allow a small misalignment when mating. The blind mating adapter unit can be installed onto the server chassis and configured for alignment before inserting the server into the server rack. The blind mating adapter unit can include an elliptical frame having an elliptical orbit about a center point of the elliptical frame, configured to position a plurality of fluid connectors within the elliptical orbit. The plurality of fluid connectors may be provided by coolant supply and return lines of a cooling module in the server. The blind mating adapter can also include an elliptical plate having a connector channel and a rotation axis. The elliptical plate is configured to rotate about the rotation axis of the elliptical frame. The plurality of fluid connectors are configured to traverse, or cross through, both the elliptical orbit of the elliptical frame and the connector channel of the elliptical plate. The blind mating adapter unit is configurable to fix an alignment of the plurality of fluid connectors to a plurality of mating fluid connectors on a coolant distribution manifold in the server rack. When the server chassis is installed into the server rack, the plurality of fluid connectors are blind mated to the mating plurality of fluid connectors on the coolant distribution manifold.

In an embodiment, the blind mating adapter unit further includes a mounting frame. The elliptical plate, elliptical frame, and rotation axis are adjustably coupled to a chassis of the server by the mounting frame. The mounting frame fixes the rotation axis of the elliptical plate at the center point of the elliptical frame. In an embodiment, the fluid connectors of the blind mating adapter unit are rotatable within ±90° or ±180° about the rotation axis. The elliptical orbit comprises two elongated and parallel sides forming a pair of parallel channels. The fluid connectors can move within the elliptical orbit as the elliptical plate is rotated about the rotation axis. The elliptical orbit of the elliptical frame and the connector channel of the elliptical plate form a rotation path for the plurality of fluid connectors. The rotation axis can comprise a bearing assembly. The bearing assembly can include a plurality of predetermined detent positions at which the elliptical plate can be rotatably positioned with the rotation path. The blind mating adapter unit can further include a connector channel sleeve whose sides are perpendicular to the elliptical plate and substantially parallel a plurality of coolant lines traversing (crossing through) the elliptical frame and elliptical plate.

In an embodiment, a location of the blind mating adapter unit on the server chassis is adjustable, using the supporting frame, in a horizontal direction (x-axis) with respect to a direction facing into the electronic rack from the front or back of the electronic rack. In an embodiment, a location of the plurality of fluid connectors can be adjusted in the vertical direction (y-axis). Adjustment in the vertical direction can be implemented by rotating the elliptical plate, by changing, or adjusting, a length of the mounting frame, or by adjusting a vertical location of the blind mating adapter unit using the supporting frame.

In a second aspect, a server can include a cooling module having a coolant supply line, a heat transfer unit, and a coolant return line. The server can further include a blind mating adapter unit having a plurality of fluid connectors that are adjustably configurable to blind mate to a corresponding plurality of mating fluid connectors on a coolant distribution manifold, as described in the first aspect, above.

FIG. 1 is a block diagram illustrating an example of a cooling module in a server chassis having a blind mating adapting unit, according to one embodiment. The cooling module 100 can include a processor/cold plate assembly that removes heat from processor chip 101. Referring to FIG. 1, processor 101 is plugged onto a processor socket mounted on printed circuit board (PCB) or motherboard 102 coupled to other electrical components or circuits of a data processing system or server. Processor 101 includes a cold plate 103 attached to it, which is coupled to a rack manifold that is coupled to liquid supply line 132 and/or liquid return line 131. The coupling of the cold plate 103 to the rack manifold, via coolant lines 131 and 132, can be via the blind mating adapter unit described herein. A portion of the heat generated by processor 101 is removed by the cooling liquid lines 131 and 132 via cold plate 103. The remaining portion of the heat enters into an air space underneath or above, which may be removed by an airflow generated by a cooling fan (not shown). A blind mating adapter unit 110, as described herein, can be coupled to the server chassis 105 using a frame (not shown). The cold plate cooling liquid lines 131 and 132 can be coupled to the blind mating adapting unit 110 mounted to the frame on the server chassis to enable blind mating of the server's cooling lines to one or more coolant distribution manifolds in the server rack that house the server chassis 105. The liquid supply line 131 and liquid return line 132 can be hoses with either blind mating connectors. The cooling module 100 included in the server chassis 105 may be used in different types of servers and server racks. Blind mating adapter unit 110 can ensure proper mating and configuration for the fluid systems between the server rack and the cooling module(s) in the server.

Figure 2:
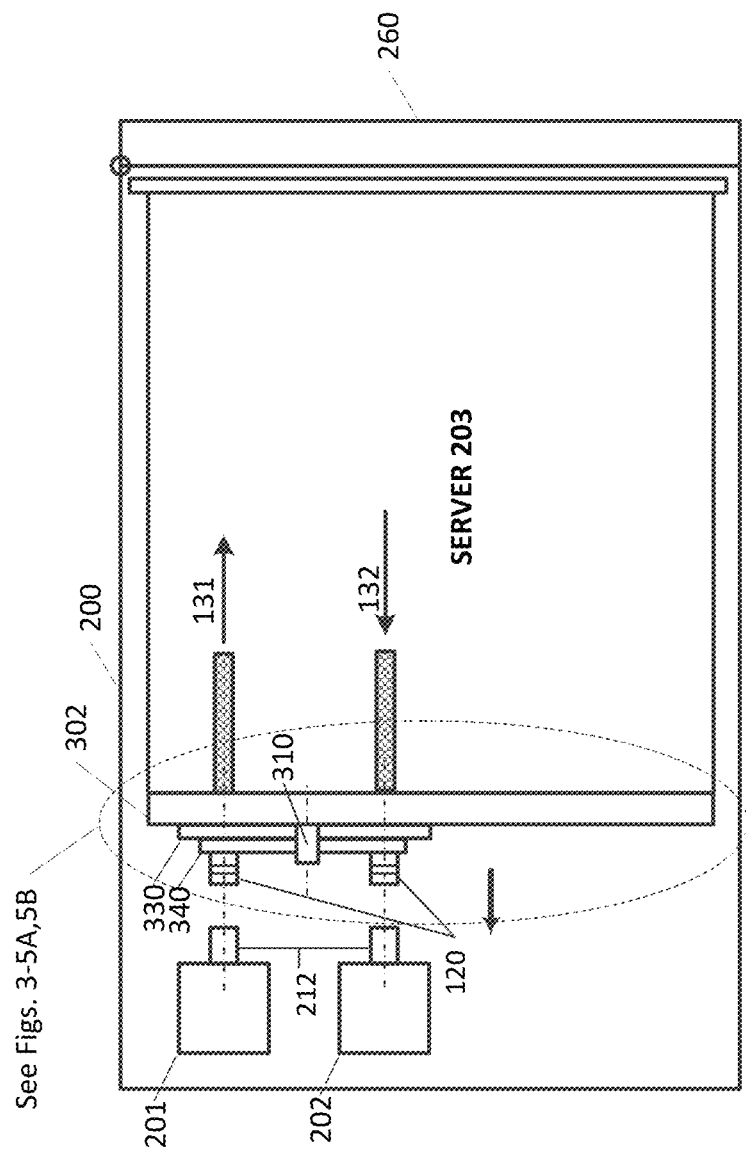
FIG. 2 illustrates plan view of an embodiment of a server chassis having a blind mating adapter unit, according to some embodiments.

FIG. 2 illustrate plan view of an embodiment of a server 203 having a blind mating adapter unit, according to some embodiments. The blind mating adapter unit enables a piece of information technology (IT) equipment, such as a server 203, to be slid into the server rack 200 and blind mated to a portion of the fluid connectors on the coolant distribution manifolds 201 and 202 (collectively, 201/2) via the blind mating adapter unit. The fluid connectors 120 on the blind mating adapter unit are initially configured to align with corresponding fluid connectors on the coolant distribution manifolds 201/2. The server 203 can be repeatedly removed from the server rack and reinstalled by blind mating, without further adjustment. In an embodiment, the blind mating adapter unit is installed into the server 203 chassis and configured for alignment before inserting the server 203 into the server rack. The blind mating adapter unit enables blind mating to fluid connectors on server rack coolant distribution manifolds for different cooling modules in a server chassis and different rack designs.

In FIG. 2, a server 203 is illustrated that has a cooling module (not shown) included within the server 203 as described above, with reference to FIG. 1. The cooling module is described above with reference to FIG. 1. The cooling module within the server 203 may include one or more hoses, tubes, or piping such as for a coolant supply line 131 and a coolant return line 132, or other coolant line. The coolant lines can be fluidly coupled at one end to the cooling module (not shown) in the server 203. The other end of each of the coolant supply 131 and coolant return lines 132 can be adjustably coupled to the blind mating adapter unit, as described herein and with reference to FIGS. 3-9. In an embodiment, the coolant lines 131 and 132 can also include fluid connectors 120 on their ends.

A blind mating adapter unit can align a plurality of fluid connectors 120 on a plurality of coolant lines 131 and 132 that traverse an elliptical frame 330 and an elliptical plate 330. An elliptical orbit of elliptical plate 330 and a connector channel or elliptical plate 340 form a rotation path within which fluid connectors 120 and coolant hoses 131 and 132 can rotate about a rotation axis (not shown). The elliptical frame 330, elliptical plate 340, and rotation axis (not shown) can be assembled to a mounting frame 310 that is coupled to a chassis of server 203 such that the fluid connectors 120 and associated coolant lines 131 and 132 can be rotatably adjusted within the rotation path. The fluid connectors 120 are rotated to align with corresponding mating fluid connectors 212 on coolant distribution manifolds 201/2. After alignment, the server 203 can be removed and reinstalled into the server rack, by blind mating, without further adjustment.

The blind mating adapter unit can be adjustably mounted to the chassis of the server 203 using mounting frame 310 and supporting frame 302. The mounting frame 310 of the blind mating adapter unit is adjustably coupled to the supporting frame 302 to facilitate alignment of the fluid connectors 120 with the corresponding mating fluid connectors 212 on the coolant distribution manifolds 201/2.

Figure 3:
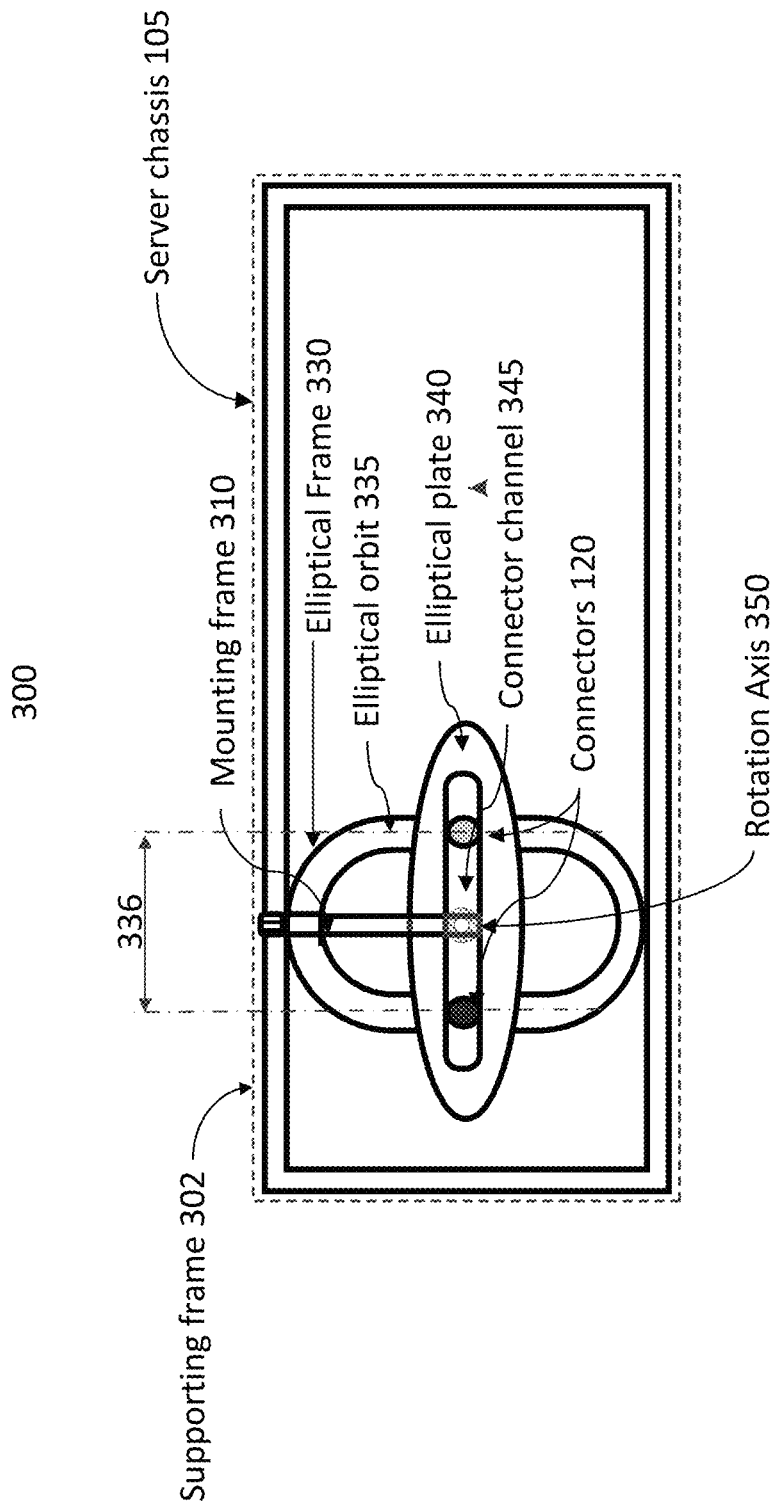
FIG. 3 illustrates an end view of a server chassis having a blind mating adapter unit, according to some embodiments.

FIG. 3 illustrates an end view of a server chassis having a blind mating adapter unit, according to some embodiments. The view is from the rear of the server rack in which the server chassis is installed. The server is installed from the front of the server rack, and slid into place inside the server rack. Upon sliding the server chassis 105 into the server rack, the fluid connectors 120 on the blind mating adapter unit 300 couple to corresponding mating fluid connectors on coolant distribution manifolds 201/202 (not shown) in the rear of the server rack (not shown). The fluid connectors 120 on the blind mating adapter unit 300 are initially configured to align with corresponding fluid connectors on the coolant distribution manifolds (not shown). The server chassis 105 can be removed and reinstalled by blind mating without further adjustment. In an embodiment, the blind mating adapter unit 300 is installed onto the server chassis 105 and configured for alignment before inserting the server chassis 105 into the server rack.

Dashed line 105 represents a chassis of the server. Blind mating adapter unit 300 can include mounting frame 310, elliptical frame 330, elliptical plate 340, and rotation axis 350. Elliptical frame 330, elliptical plate 340, and rotation axis 350 can be coupled using mounting frame 310. Mounting frame 310 can be adjustably coupled to supporting frame 302. In an embodiment, mounting frame 310 can be adjusted in a left-right direction (x-axis), across the long edge of the server chassis 105. Supporting frame 302 can be coupled to server chassis 105.

Elliptical frame 335 comprises an elongated oval or "racetrack" shape having two elongated parallel sides 336. Elliptical plate 340 comprises an oblong plate having a straight connector channel 345 with rounded ends. Elliptical frame 330 forms an open channel termed an elliptical orbit 335. Fluid connectors 120, and their associated coolant supply and return lines (not shown), traverse, or "go through", the elliptical orbit 335 and the connector channel 345 of elliptical plate 340. A location of the fluid connectors 120, and associated coolant supply and return lines (not shown), is determined by the intersection of the fluid connector 120 and coolant line with the connector channel 345 of the rotatable elliptical plate 340 and the elliptical orbit 335 of the elliptical frame 330. Elliptical plate 340 can be rotated about the rotation axis 350 causing the locations of the fluid connectors 120 to follow the connector channel 345 of the rotatable elliptical plate 340 and the elliptical orbit 335 of the elliptical frame 330. Fluid connectors 120 can be aligned for blind mating with corresponding mating fluid connectors on the coolant distribution manifolds 201/2 (not shown).

A manner of assembling of the coolant lines (not shown) and fluid connectors 120 with the blind adapting unit 300 can depend upon how the coolant lines are furnished with the cooling module in the server. In a typical installation, the coolant lines may be furnished with one end of each coolant line pre-coupled to the coolant module inside the server. A server provider may typically assume that it is the end user's responsibility to determine how to couple the other end of each coolant line to the coolant distribution manifold in the server rack according to that particular user's coolant distribution manifold and server rack configuration. Accordingly, a server manufacturer may furnish coolant lines with the server such that the end of each coolant line that is to be connected with a coolant distribution manifold is either (1) furnished with no fluid connector, (2) furnished with a loose, uninstalled fluid connector, or (3) furnished with a fluid connector installed on the end of the coolant line that is to be coupled to the coolant distribution manifold. In the latter case, (3), the fluid connector that is installed on the coolant line can be removed. Then for all cases (1), (2), and (3), the coolant line can be inserted from the back side (the side facing the cooling module in the server) of the blind mating adapter unit, through the elliptical orbit 335, and through the connector channel 345. Then the fluid connector 120 can be installed on the end of the coolant line (not shown).

The elliptical orbit 335, connector channel 345, and fluid connectors 120 are configured to (1) slidably fit the coolant line (with fluid connectors 120 removed) through the elliptical orbit 335 and connector channel 345, (2) to enable rotation of the elliptical plate 340 with the coolant line and fluid connectors 120 coupled, (3) prevent the fluid connectors 120 from being pushed through the connector channel and/or elliptical orbit 335 due to the force of blind mating when installing the server into the server rack, and (4) secure the fluid connectors 120 to the blind mating adapter unit such that the force of removing server and disconnecting the blind mated fluid connectors does not pull the coolant line out from the blind mating adapter unit, the server, or from the coolant module. To address these issues, a width of the elliptical orbit 335 and a width of the connector channel 345 can be selected to be slightly larger than an outside diameter of the coolant line (not shown). Slightly larger can be, e.g. 1 to 2 mm or 1/32" to 1/16" greater than the outside diameter of the coolant line. In this way, the coolant line is free to move within the elliptical orbit 335 and connector channel 345 as the elliptical plate 340 is rotated. Similarly, a width of elliptical orbit 335 and a width of the connector channel 345 is selected to be slightly smaller than an outer dimension of the fluid connector 120. This prevents the fluid connector 120 from being pushed through connector channel 345 or the elliptical orbit 335 due to the force of blind mating the fluid connectors 120 with corresponding mating fluid adapters on the coolant distribution manifold, when installing the server into the server rack. In an embodiment, a washer or similar mechanical object can be placed between the fluid connector 120 and the elliptical plate 340 to prevent the fluid connector 120 from being pushed through the connector channel 345 during blind mating. In an embodiment, a mechanical retainer element, such as a hose clamp, rubber collar, or other mechanical restraint, can be installed on the coolant line (not shown) before inserting the coolant line through elliptical orbit 335 and the connector channel 345, to prevent the coolant line from being pulled out from the server due to the force of disconnecting the blind mated fluid connectors when removing the server from the server rack.

Figure 4:
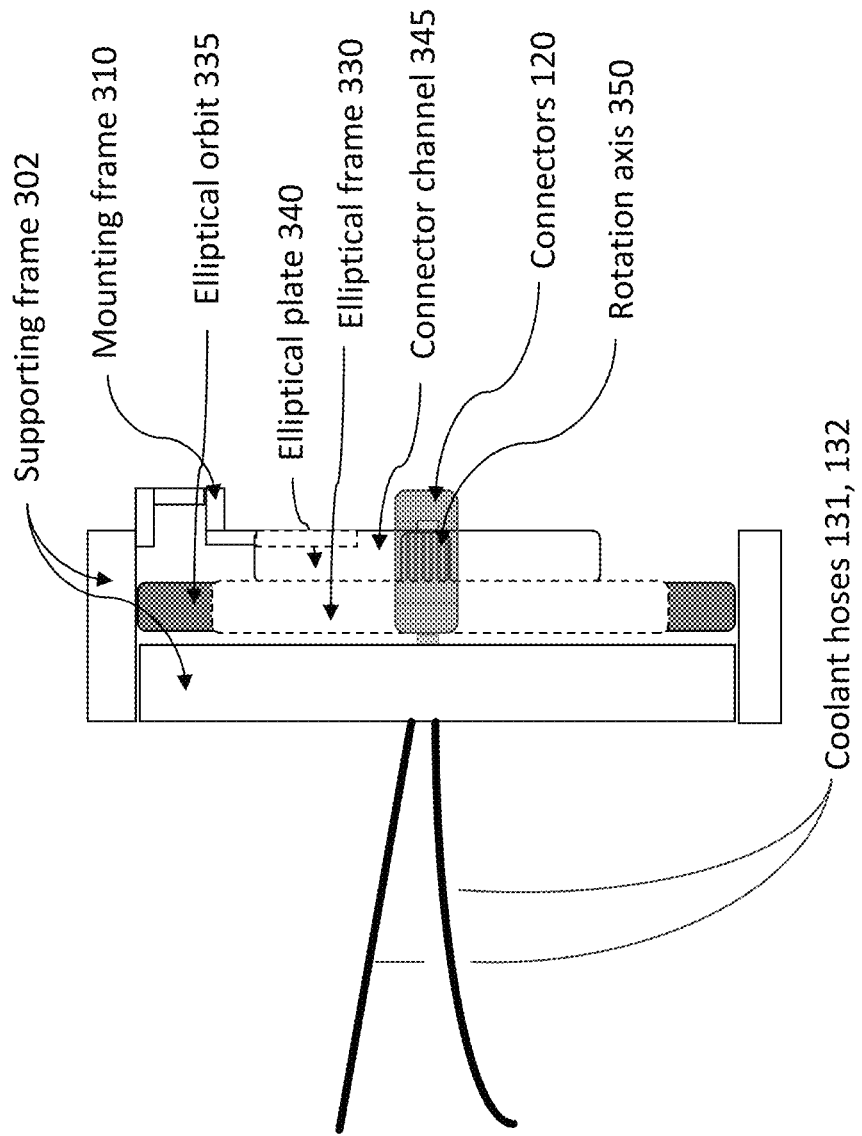
FIG. 4 illustrates is a section view of a blind mating adapter unit for use in a server chassis, according to some embodiments.

FIG. 4 illustrates is a section view of a blind mating adapting unit for use in a server chassis, according to some embodiments. Supporting frame 302 can be attached to a chassis of the server (not shown). Mounting frame 310 can couple elliptical frame 330, elliptical plate 340, and rotation axis 350 to supporting frame 302. In this section view, fluid connectors 120 are positioned substantially horizontally, such that a first fluid connector 120 (shaded) appears in front of rotation axis 350. A second fluid connector 120 (not visible) is positioned behind both the first fluid connector 120 (shaded) and rotation axis 350. A first end of each coolant line 131 and 132 (collectively, 131/2) has a fluid connector coupled to the coolant line 131/2 through the blind mating adapter unit. A second end (not shown) of each coolant line 131/2 can be coupled to the cooling module inside the server (not shown).

Figures 5A, 5B:
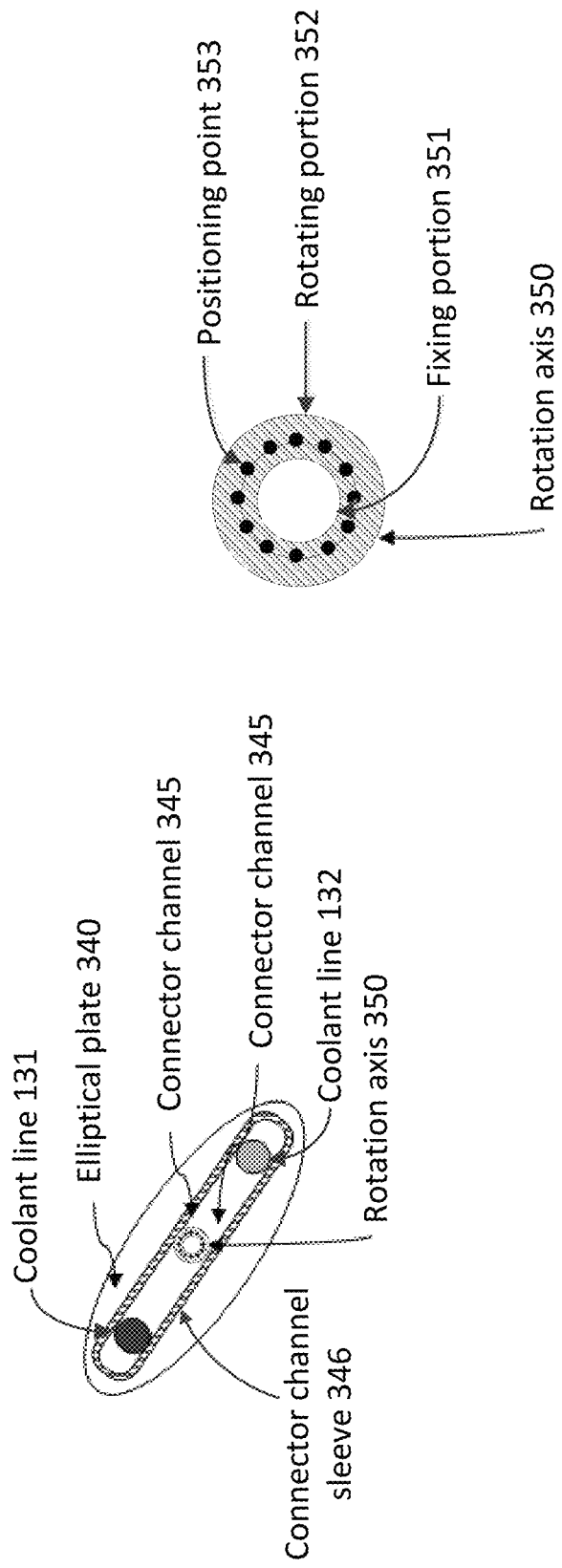
FIGS. 5A and 5B illustrate detail views of components of a blind mating adapter unit according to some embodiments.

FIGS. 5A and 5B illustrate detailed views of components of a blind mating adapter unit according to some embodiments.

Referring now to FIG. 5A, a portion of the blind mating adapter includes an elliptical plate 340 having a connector channel 345 centered about a rotation axis 350. As described above, with reference to FIGS. 2 through 4, the elliptical frame (not shown here), elliptical plate 340, and rotation axis 350 can be coupled together by mounting frame (not shown here). As also described above, with reference to FIGS. 2 through 4, coolant lines 131 can 132 can be inserted from the back of the blind mating adapter unit (from the cooling module inside the server) through the elliptical frame (not shown here) and elliptical plate 340. The coolant lines 131 and 132 are configured to rotate or adjust along a rotation path defined by the elliptical orbit of elliptical frame (not shown) and the connector channel 345 of elliptical plate 340. Elliptical plate 340 can have a connector channel sleeve 346 configured to facilitate smooth rotation of the cooling lines 131 and 132 along the rotation path, to reduce or eliminate binding of the coolant lines 131 and 132 during rotation along the rotation path, and to guide the coolant lines toward the mating fluid connectors on the coolant distribution manifolds (not shown). Connector channel sleeve 346 can be, e.g., a band of metal, e.g. ½" to 1" wide, shaped as shown in FIG. 5A, and welded, brazed, or otherwise physically attached to elliptical plate 340. In an embodiment, elliptical plate 340 can start as a single portion of metal, e.g. 1/16" thick steel, aluminum, or stainless steel, and the connector channel 345 and connector channel sleeve 346 can be formed by a metal press or stamping operation.

Referring now to FIG. 5B, the rotation axis 350 is a unit which includes a fixing portion 351 that is fixedly coupled to the mounting frame (not shown) and does not rotate. The rotating portion 352 is free to rotate as the elliptical plate 340 is rotated. The elliptical plate 340 is rotated to position coolant lines 131 and 132 and their respective fluid connectors (not shown) for alignment with the mating connectors on the coolant distribution manifold. In an embodiment, the rotating portion 352 rotates smoothly and continuously with respect to the fixing portion 351. In an embodiment, there are a plurality of predetermined positioning points 353 that act as detents, to stop the rotation at one of the predetermined points 353. When rotating the elliptical plate 340, the rotating portion 352 can mechanically stop at one of the positioning points 353. With additional rotating force applied to the elliptical plate 340, the detent can be overcome and the rotation of the elliptical plate 340 can stop at a next positioning point 353.

Figure 6:
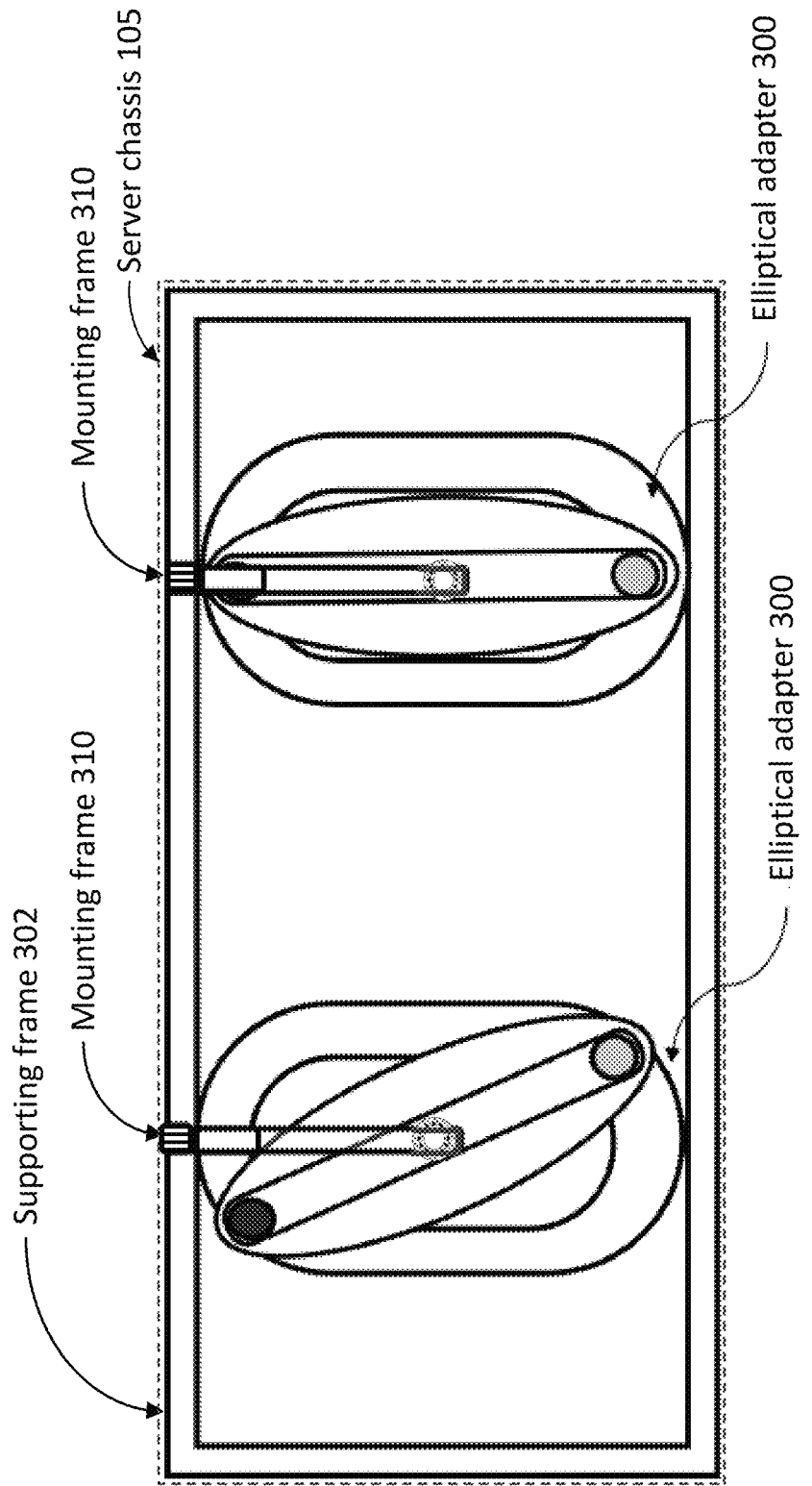
FIG. 6 illustrates an end view of a server chassis having two blind mating adapter units, according to some embodiments.

FIG. 6 illustrates an end view of a server chassis 105 having two elliptical blind mating adapter units 300, according to some embodiments. The blind mating adapter units 300 can be as described with referenced to FIGS. 2-4 and 5A and 5B, above. Embodiments as shown in FIG. 6 can be used, e.g., when a single server chassis 105 includes two cooling modules, each cooling module having its own respective pair of coolant supply and return lines. FIG. 6 can also be used when a single cooling module requires greater coolant flow that can be provided by a single coolant distribution manifold. In such case, a coolant supply line from the elliptical adapter 300 on the left may be coupled to a coolant supply line from the elliptical adapter 300 on the right using, e.g., a 2-into-1 connector inside the server chassis, and can be coupled to a single larger coolant supply on the cooling module. Similarly, the single, larger coolant return line from the cooling module may be split using a 1-into-2 connector inside the server, and one of the two coolant return lines can be coupled to the elliptical adapter 300 on the left and one of the coolant return lines can be coupled to the coolant return line of the right elliptical adapter 300.

As described above with reference to FIGS. 1-4 and 5A and 5B, each of the two elliptical adapters can be assembled to its own mounting frame 310, and each mounting frame 310 can be slidably coupled to the supporting frame 302. The supporting frame 302 is coupled to the server chassis 105.

Figure 7:
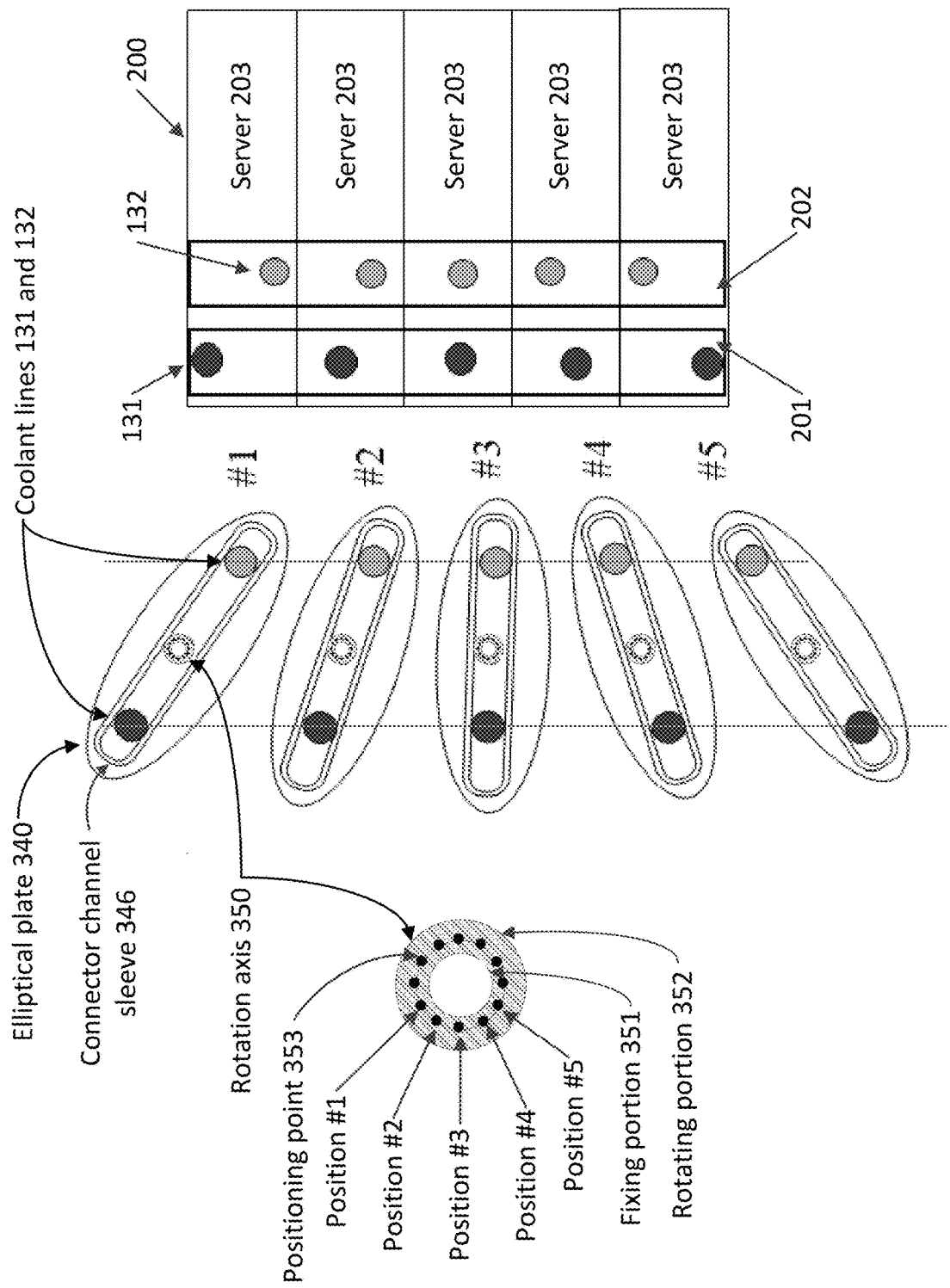
FIG. 7 illustrates an end view of details of components of a blind mating adapter unit, according to one embodiment.

FIG. 7 illustrates and end view of details of components of a blind mating adapter unit, according to one embodiment. More specifically, FIG. 7 illustrates the relationship between predetermined fixed positions of the rotation axis 350, corresponding positions of the elliptical plate 340 and coolant lines 131 and 132, and coolant distribution manifolds 201 and 202 in server rack 200.

FIG. 7 is divided into three related portions. At left in FIG. 7 is a rotation axis 350 as described with reference to FIG. 5B, above. The rotation axis 350 illustrates predetermined fixed positions #1 through #5. At center in FIG. 7, an elliptical plate 340 having a rotation axis 350 is shown at predetermined fixed positions #1 through #5, corresponding to positions #1 through #5 of the rotation axis 350. The elliptical plate 340 is described above with reference to FIG. 5A. At right in FIG. 7, a server rack 200 containing a plurality of servers 203 is shown. Each server 203 is configured to blind mate coolant lines 131 and 132 from the server 203 to coolant distribution manifolds 201 and 202 using the blind mating adapter described in FIGS. 1-6, above. Positions of coolant lines 131 and 132 for each server 203 are as shown in corresponding positions #1 through #5 of the rotation axis 350 and positions #1 through #5 of the elliptical plate 340 having the rotation axis 350. References 131 and 132 can also be understood as the end of the coolant supply line and coolant return line, which are the fluid connectors. They can also be understood as the fluid connectors that will blind mate to corresponding fluid connectors on the coolant distribution manifold.

Figure 8:
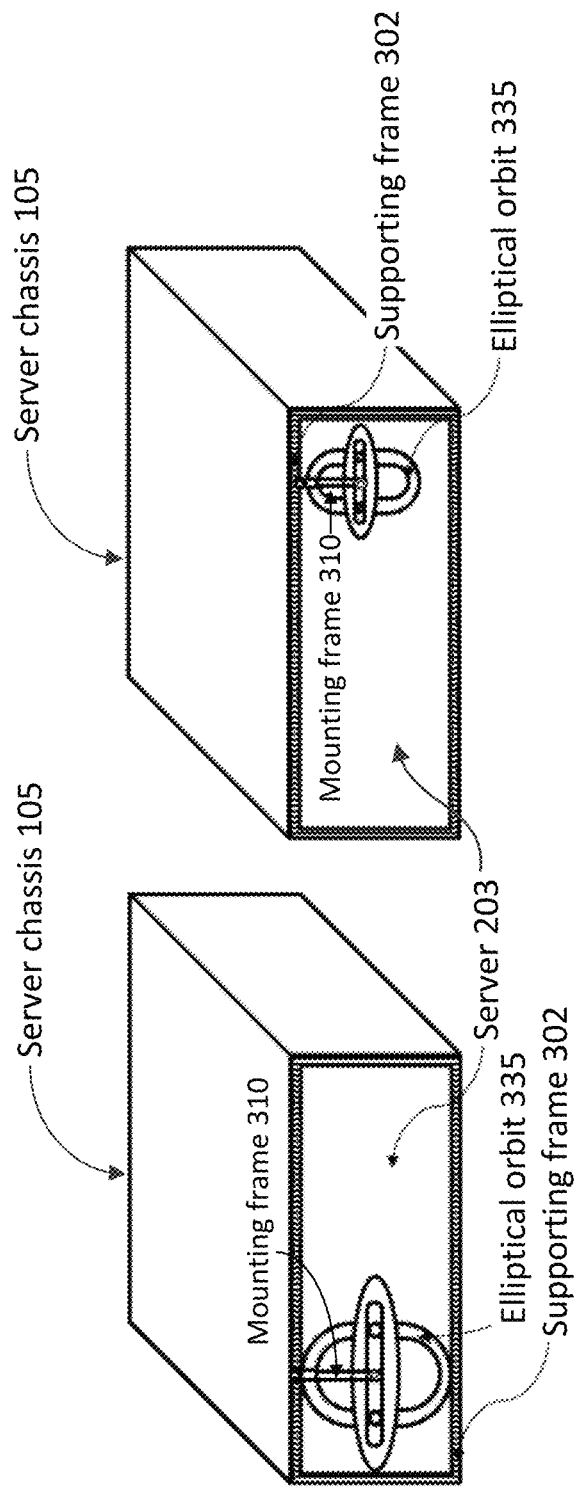
FIG. 8 illustrates a perspective view of two server chassis each having a blind mating adapter unit, according to one embodiment.

FIG. 8 illustrates a perspective view of two server chassis each having a blind mating adapter unit, according to one embodiment. As indicated in FIG. 8, different blind mating adapter units can have different sided elliptical orbits 335 and different elliptical plates for different separation or configuration of coolant distribution manifolds 201 and 202 (not shown). The blind mating adapter units can be slidably coupled to a supporting frame 302 that is coupled a server chassis 105. When each of the server chassis 105 is installed into a server rack (not shown), the fluid connectors of the blind mating adapters are configured to blind mate to corresponding mating adapters on coolant distribution manifolds (not shown). In an embodiment, a location of the blind mating adapter unit on the server chassis is adjustable, using the supporting frame, in a horizontal direction (x-axis) with respect to a direction facing into the electronic rack from the front or back of the electronic rack. In an embodiment, a location of the plurality of fluid connectors can be adjusted in the vertical direction (y-axis). Adjustment in the vertical direction can be implemented by rotating the elliptical plate 340, by changing, or adjusting, a length of the mounting frame 310, or by adjusting a vertical location of the blind mating adapter unit using the supporting frame 302.

Figure 9:
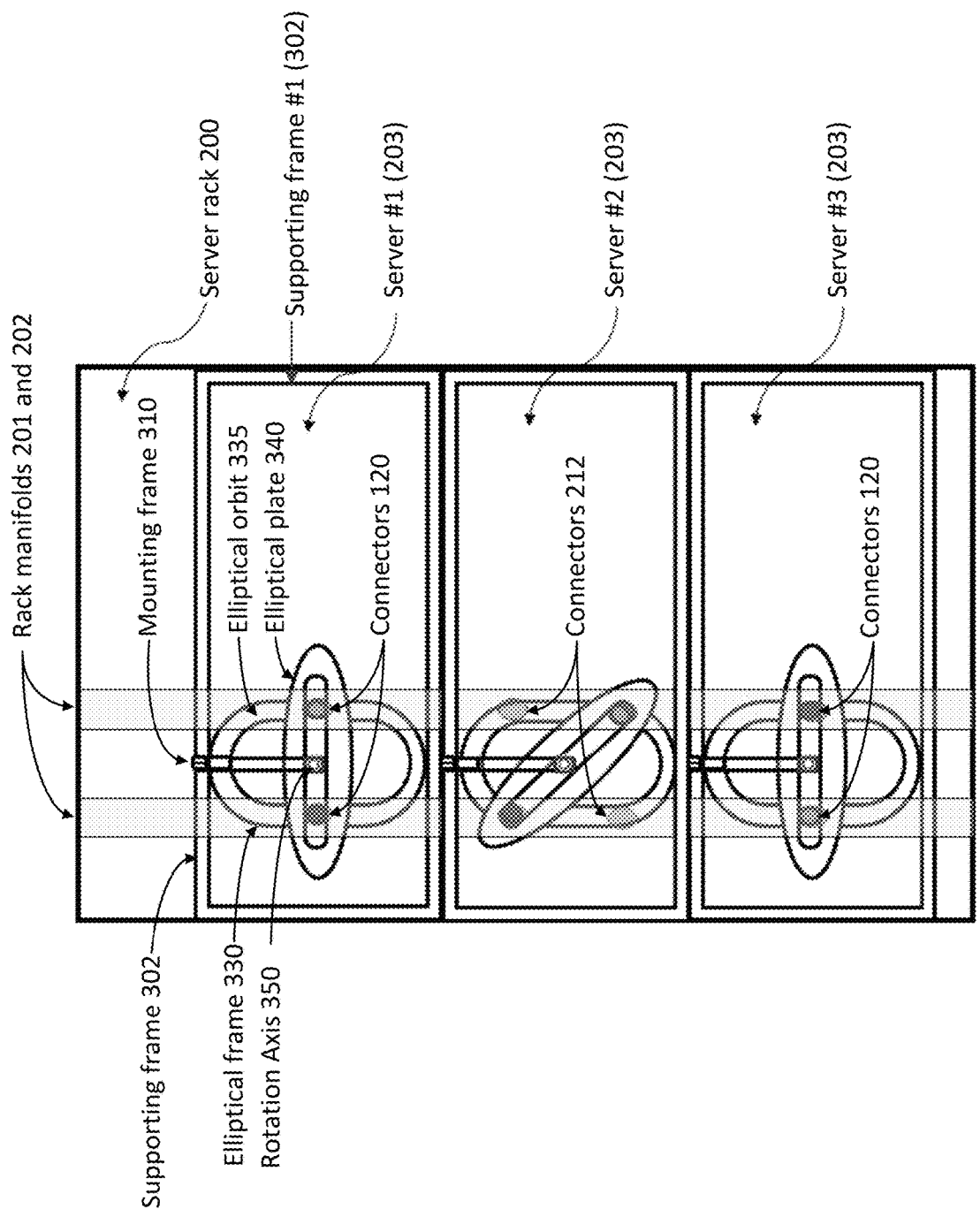
FIG. 9 illustrates an end view of a plurality of server chassis in a server rack, each server having a blind mating adapter unit, according to one embodiment.

FIG. 9 illustrates an end view of a plurality of servers 203 in a server rack 200, each server 203 having a blind mating adapter unit with an elliptical frame 330, elliptical orbit 335, and elliptical plate 340. Connector channel 345 and elliptical orbit 334 define a rotation path for fluid connectors 120 of coolant lines (not shown). The elliptical frame 330, elliptical plate 340, and rotation axis 350 are coupled to mounting frame 310. Mounting frame 310 is slidably coupled to supporting frame 302. Mounting frame 310 is slidably adjusted to center the rotation axis 350 between rack manifolds 201 and 202. Elliptical plate 340 is rotated to align fluid connectors 120 to blind mate with corresponding mating fluid connectors on rack manifolds 201 and 202. After initial alignment of the blind mating adapter and fluid connectors on the server to the corresponding mating adapters on the rack manifolds, the server can be repeatedly removed and re-installed without further alignment of the fluid connectors using the blind mating adapter unit.

With respect to server #2 (203), an example of two unused fluid connectors 212 is shown. Unused fluid connectors 212 are mating connectors on coolant distribution manifolds 201 and 202. As shown in FIG. 5, with reference to position #5, a user could have chosen to rotate elliptical plate 340 approximately 90° counter-clockwise from the position shown in FIG. 9 for server #2 (203), to use coolant distribution manifold connectors 212 for blind mating, instead of using the coolant distribution manifold fluid connectors as shown in FIG. 9 for server #2 (203).

In the foregoing specification, embodiments of the invention have been described with reference to specific exemplary embodiments thereof. Different selection of connector types, hose, tubing, piping, and structural frame members, and orientations of assemblies can be implemented by one of skill in the art in possession of this disclosure. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A blind mating adapter unit configured to fluidly couple a server chassis in an electronic rack to one or more coolant distribution manifolds via blind mating, the blind mating adapter unit comprising:
   an elliptical frame having an elliptical orbit about a center point of the elliptical frame configured to position a plurality of fluid connectors within the elliptical orbit; and
   an elliptical plate having a connector channel and a rotation axis, wherein the elliptical plate is configured to rotate about the rotation axis of the elliptical plate,
   wherein the plurality of fluid connectors are configured to traverse both the elliptical orbit of the elliptical frame and the connector channel of the elliptical plate, and
   wherein the blind mating adapter unit is configurable to fix an alignment of the plurality of fluid connectors to a plurality of mating fluid connectors on one or more coolant distribution manifolds in the electronic rack, such that when the server chassis is installed into the electronic rack, the plurality of fluid connectors are blind mated to the mating plurality of fluid connectors on the one or more coolant distribution manifolds.

2. The blind mating adapter unit of claim 1, further comprising a mounting frame, wherein the elliptical plate and elliptical frame are adjustably coupled to the server chassis by the mounting frame, and the mounting frame fixes the rotation axis of the elliptical plate at the center point of the elliptical frame.

3. The blind mating adapter unit of claim 2, wherein the plurality of fluid connectors are rotatable approximately ±90° or ±180° about the rotation axis, wherein a change in rotation of the elliptical plate about the rotation axis is configured to align the plurality of fluid connectors on the blind mating adapter unit to different configurations of the one or more coolant distribution manifolds or different relative locations of the plurality of mating fluid connectors on the one or more coolant distribution manifolds.

4. The blind mating adapter unit of claim 2, wherein a location of the plurality of fluid connectors on the server chassis is adjustable in a lateral direction (x-axis) and in a vertical direction (y-axis) with respect to a direction facing into the electronic rack from the front or back of the electronic rack.

5. The blind mating adapter unit of claim 1, wherein the elliptical orbit comprises two elongated and parallel sides forming a pair of parallel channels.

6. The blind mating adapter unit of claim 1, wherein the elliptical orbit of the elliptical frame and the connector channel of the elliptical plate form a rotation path for the plurality of fluid connectors.

7. The blind mating adapter unit of claim 6, the elliptical frame, elliptical plate, and rotation axis can be coupled together using a mounting frame, wherein the rotation axis comprises a bearing assembly and the rotation axis.

8. The blind mating adapter unit of claim 7, wherein the bearing assembly comprises a plurality of predetermined detent positions at which the elliptical plate can be rotatably positioned within the rotation path.

9. The blind mating adapter unit of claim 1, wherein each fluid connector in the plurality of fluid connectors is coupled to one or more coolant lines of a cooling module within the server chassis.

10. The blind mating adapter unit of claim 1, wherein the elliptical plate further comprises a connector channel sleeve whose sides are perpendicular to the elliptical plate and substantially parallel a plurality of coolant hoses coupled to the plurality of fluid connectors, the coolant hoses traversing the elliptical frame and elliptical plate.

11. A server of an electronic rack, comprising:
   a cooling module comprising a coolant supply line, a heat transfer unit, and a coolant return line, wherein a first end of the coolant supply line and a first end of the coolant return line are coupled to the heat transfer unit;
   a blind mating adapter unit adjustably coupled to a server chassis of the server, wherein the blind mating adapter unit includes:
      an elliptical frame having an elliptical orbit about a center point of the elliptical frame configured to position a plurality of fluid connectors within the elliptical orbit;
      an elliptical plate having a connector channel and a rotation axis, wherein the elliptical plate is configured to rotate about the rotation axis of the elliptical frame;
      wherein the plurality of fluid connectors and a second end of the coolant supply line and a second end of the coolant return line are configured to traverse both the elliptical orbit of the elliptical frame and the connector channel of the elliptical plate, and
      wherein the blind mating adapter unit is configurable to fix an alignment of the plurality of fluid connectors to a plurality of mating fluid connectors on one or more coolant distribution manifolds in the electronic rack, such that when the server chassis is installed into the electronic rack, the plurality of fluid connectors are blind mated to the mating plurality of fluid connectors on the one or more coolant distribution manifolds.

12. The server of claim 11, wherein the blind mating adapter unit further comprises a mounting frame, wherein the elliptical plate and elliptical frame are adjustably coupled to the server chassis by the mounting frame, and the mounting frame fixes the rotation axis of the elliptical plate at the center point of the elliptical frame.

13. The server of claim 12, wherein the plurality of fluid connectors are rotatable approximately ±90° or ±180° about the rotation axis, wherein a change in rotation of the elliptical plate about the rotation axis is configured to align the plurality of fluid connectors on the blind mating adapter unit to different configurations of the one or more coolant distribution manifolds or different relative locations of the plurality of mating fluid connectors on the one or more coolant distribution manifolds.

14. The server of claim 11, wherein the plurality of fluid connectors are provided with coolant supply and coolant return lines of the cooling module in the server.

15. The server of claim 14, wherein a location of the plurality of fluid connectors on the server chassis is adjustable in a lateral direction (x-axis) and in a vertical direction (y-axis) with respect to a direction facing into the electronic rack from the front or back of the electronic rack.

16. The server of claim 11, wherein the elliptical orbit comprises two elongated and parallel sides forming a pair of parallel channels.

17. The server of claim 11, wherein the elliptical orbit of the elliptical frame and the connector of the elliptical plate form a rotation path for the plurality of fluid connectors.

18. The server of claim 17, wherein the rotation axis comprises a bearing assembly and the rotation axis is coupled to the mounting frame.

19. The server of claim 18, wherein the bearing assembly comprises a plurality of predetermined detent positions at which the elliptical plate can be rotatably positioned within the rotation path.

20. An electronic rack, comprising:
  one or more coolant distribution manifolds; and
  a plurality of servers arranged in a stack, wherein each server includes:
    a cooling module comprising a coolant supply line, a heat transfer unit, and a coolant return line, wherein a first end of the coolant supply line and a first end of the coolant return line are coupled to the heat transfer unit;
    a blind mating adapter unit adjustably coupled to a server chassis of the server, wherein the blind mating adapter unit includes:
      an elliptical frame having an elliptical orbit about a center point of the elliptical frame configured to position a plurality of fluid connectors within the elliptical orbit;
      an elliptical plate having a connector channel and a rotation axis, wherein the elliptical plate is configured to rotate about the rotation axis of the elliptical frame;
      wherein the plurality of fluid connectors and a second end of the coolant supply line and a second end of the coolant return line are configured to traverse both the elliptical orbit of the elliptical frame and the connector channel of the elliptical plate, and
      wherein the blind mating adapter unit is configurable to fix an alignment of the plurality of fluid connectors to a plurality of mating fluid connectors on the one or more coolant distribution manifolds in the electronic rack, such that when the server chassis is installed into the electronic rack, the plurality of fluid connectors are blind mated to the mating plurality of fluid connectors on the one or more coolant distribution manifolds.

* * * * *